Figure 1:
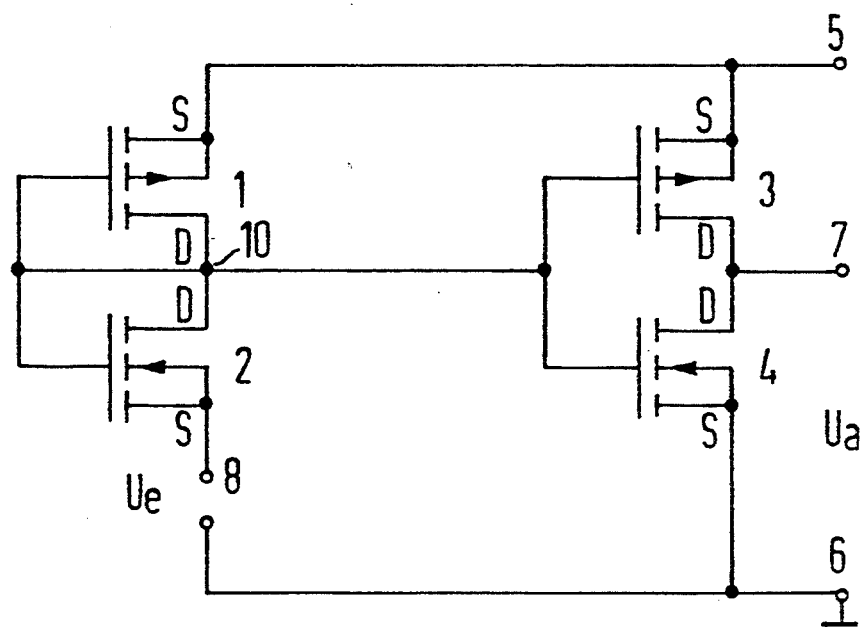

United States Patent [19]

Leipold et al.

[11] Patent Number: 5,434,521
[45] Date of Patent: Jul. 18, 1995

[54] INTEGRATED COMPARATOR CIRCUIT

[75] Inventors: Ludwig Leipold; Rainald Sander; Jenoe Tihanyi, all of Munich, Germany

[73] Assignee: Siemens Aktiengesellschaft, Munich, Germany

[21] Appl. No.: 978,637

[22] Filed: Nov. 19, 1992

[30] Foreign Application Priority Data

Nov. 26, 1991 [DE] Germany ............... 41 38 860.7

[51] Int. Cl.⁶ ............................................. H03K 5/153
[52] U.S. Cl. ......................................................... 327/78
[58] Field of Search ............... 307/354, 362, 568, 350, 307/355; 327/77, 78, 79

[56] References Cited

U.S. PATENT DOCUMENTS

| | | | |
|---|---|---|---|
| 4,544,853 | 10/1985 | Neal et al. | 307/355 |
| 4,658,156 | 4/1987 | Hashimoto | 307/350 |
| 4,709,172 | 11/1987 | Williams | 307/585 |
| 5,043,599 | 8/1991 | Zitta | 307/362 |
| 5,099,146 | 3/1992 | Miki et al. | 307/350 |
| 5,274,275 | 12/1993 | Colles | 307/354 |
| 5,287,070 | 2/1994 | Thelen et al. | 307/355 |
| 5,289,054 | 2/1994 | Lucas | 307/355 |

FOREIGN PATENT DOCUMENTS 3912713 10/1989 Germany.
3906482 9/1990 Germany.

OTHER PUBLICATIONS

Publication by Tietze-Schenk: "Halbleiter-Schaltungs-technik" ((Semiconducor Circuitry) 7th Edition; pp. 140–143 (no date).
Publication by Tietze-Schenk: "Electronic Circuits 1991" pp. 125–128, Jan. 1991.

*Primary Examiner*—Willis R. Wolfe
*Attorney, Agent, or Firm*—Herbert L. Lerner; Laurence A. Greenberg

[57] ABSTRACT

An integrated comparator circuit includes two complementary MOSFETs having main current paths being connected together in a series circuit at a connecting point. An inverter stage has two complementary MOSFETs with gate terminals connected to the connecting point. First, second and third terminals are provided. The first and second terminals are for an operating voltage, and the second and third terminals are for a voltage to be compared. The series circuit is connected between the first and third terminals, and the inverter stage is connected between the first and second terminals. One of the MOSFETs of the series circuit connected to the first terminal and one of the MOSFETs of the inverter stage connected to the first terminal are of the same channel type. The other of the MOSFETs of the series circuit connected to the third terminal and the other of the MOSFETs of the inverter stage connected the second terminal are of the same channel type.

2 Claims, 1 Drawing Sheet

INTEGRATED COMPARATOR CIRCUIT

SPECIFICATION

The invention relates to an integrated comparator circuit having an inverter stage including two complementary transistors, two further complementary transistors forming a series circuit with respect to their main current paths, and first and second terminals for an operating voltage.

One such comparator circuit has been described, for instance, in the book by Tietze and Schenk entitled "Halbleiter-Schaltungstechnik" [Semiconductor Circuitry], 7th Edition, pp. 140 ff. That circuit includes bipolar transistors, resistors, and current sources. If different comparators of one and the same type are to have identical properties, then the parameters of transistors of an input differential amplifier must be highly replicable. The absolute value of the switching point of the operational amplifier also depends on the current sources. Nor can its properties always be adjusted simply and replicably. The integrated resistors that are used can also fluctuate with regard to their properties. A further consideration is that production variations can have very different effects on the components, which differ in terms of their structure.

It is accordingly an object of the invention to provide an integrated comparator circuit, which overcomes the hereinafore-mentioned disadvantages of the heretofore-known devices of this general type, which needs no current sources or resistors and in which only identical components are used.

With the foregoing and other objects in view there is provided, in accordance with the invention, an integrated comparator circuit, comprising two complementary MOSFETs having main current paths being connected together in a series circuit at a connecting point, an inverter stage having two complementary MOSFETs with gate terminals connected to the connecting point, first, second and third terminals, the first and second terminals being for an operating voltage, and the second and third terminals being for a voltage to be compared, the series circuit being connected between the first and the third terminals, and the inverter stage being connected between the first and the second terminals, one of the MOSFETs of the series circuit connected to the first terminal and one of the MOSFETs of the inverter stage connected to the first terminal being of the same channel type, and the other of the MOSFETs of the series circuit connected to the third terminal and the other of the MOSFETs of the inverter stage connected the second terminal being of the same channel type.

In accordance with another feature of the invention, the MOSFETs of the series circuit have gate terminals and drain terminals being connected to one another.

In accordance with a concomitant feature of the invention, all of the MOSFETs have characteristic transmission curves, the characteristic transmission curves of the MOSFETs connected to the first terminal are equal, and the characteristic transmission curve of the MOSFET connected to the third terminal is steeper than the characteristic transmission curve of the MOSFET connected to the second terminal.

Other features which are considered as characteristic for the invention are set forth in the appended claims.

Although the invention is illustrated and described herein as embodied in an integrated comparator circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 2:
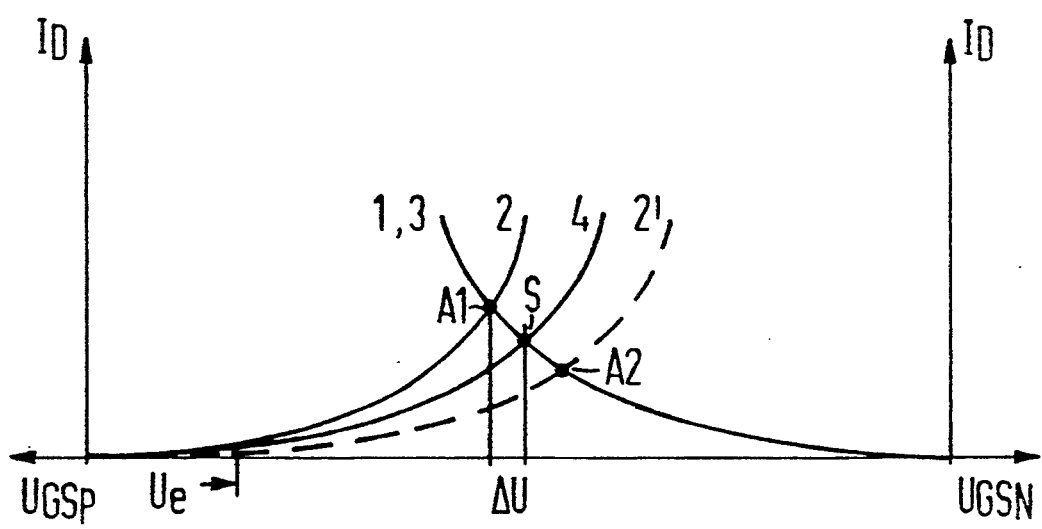

FIG. 1 is a schematic circuit diagram showing a preferred exemplary embodiment of the invention; and FIG. 2 is a diagram with which the mode of operation of the invention is explained.

Referring now to the figures of the drawing in detail and first, particularly, to FIG. 1 thereof, there is seen an integrated comparator which includes an inverter stage with a p-channel MOSFET 3 and an n-channel MOSFET 4. The two MOSFETs 3, 4 are connected to one another on the drain side. The source terminal of the MOSFET 3 is connected to a first terminal 5, while the source terminal of the MOSFET 4 is connected to a second terminal 6. A supply voltage $V_{DD}$ is applied to the terminals 5, 6. The drain connections of the two transistors are connected to an output terminal 7. The integrated comparator circuit also includes series-connected complementary MOSFETs 1 and 2. The source terminal of a p-channel MOSFET 1 is connected to the terminal 5, and the source terminal of an n-channel MOSFET 2 is connected to a third terminal 8. The drain terminals of the MOSFETs 1 and 2 are electrically connected to one another. A connecting point 10 is connected to the gate terminals of the MOSFETs 3 and 4 of the inverter stage. The gate terminals of the MOSFETs 1 and 2 of the series circuit are connected to their drain terminals, so that both MOSFETs function as MOS diodes. The terminals 6 and 8 form an input for a voltage $U_e$ to be compared.

If the voltage to be compared is zero, then the source terminal of the MOSFET 2 is connected to 0 V through a generator that furnishes the voltage $U_e$. The MOSFETs 1 and 2 form a voltage divider that establishes a predetermined potential at the connection point 10. The voltage divider ratio is selected in such a way that in the state where $U_e = 0$ V, the MOSFET 3 is controlled to be conducting to such an extent that it forms a smaller resistor than the MOSFET 4. The voltage at the terminals 6, 7 is accordingly at the H level. This state is represented in FIG. 2 by an intersection A1 of characteristic transmission lines ($U_{GS}/I_D$) of the MOSFETs 1 and 2. The characteristic transmission curves of the MOSFETs 1 and 2 are also indicated with the respective reference numerals 1 and 2 in FIG. 2. A switching point S of the inverter is represented by the intersection of the characteristic transmission curves of the MOSFETs 3 and 4. Their characteristic transmission curves are indicated with the respective reference numerals 3 and 4 in FIG. 2.

If a positive voltage $U_e$ is applied to the terminals 8, 6, then the potential at the connection point 10 shifts in the direction of the supply voltage $V_{DD}$. This makes the MOSFET 4 more strongly conducting, while the conductivity of the MOSFET 3 decreases. The output voltage $U_a$ accordingly drops to the level "L". The negative voltage excursion at the output accordingly signals that a voltage $U_e$ is present at the input 6, 8. The voltage $U_a$ can then be delivered to a Schmitt trigger, having output signal levels that are selected in such a way that they are equivalent to logical "0" or logical "1".

In order to establish a defined response threshold of the comparator circuit where the voltage $U_e$ is greater than 0 V, the characteristic transmission lines of the MOSFETs 2 and 4 are selected to be different from one another. The characteristic transmission curves of the MOSFETs 1 and 3 may be identical but need not be so. The diagram in FIG. 2 assumes that the characteristic transmission curves of the MOSFETs 1 and 3 are identical, but that the MOSFET 2 has a characteristic transmission curve that has a steeper course than that of the MOSFET 4. A response threshold $\Delta U$ which is greater than 0 V is thus attained. Application of the voltage $U_a$ then shifts the characteristic transmission line to a range which allows an unequivocal distinction between the two states at the output 6, 7 of the inverter. The shifted characteristic transmission curve of the MOSFET 2 is shown in dashed lines in FIG. 2 and is indicated with reference numeral 2'. This sets an intersection A2 as the operating point.

As a special case, it would also be conceivable for the characteristic transmission curves of the MOSFETs 2 and 4 to be identical. However, the comparator circuit would then already respond at $U_e=0$ V.

In a modification of the exemplary embodiment, it is also possible for the voltage $U_e$ to be applied between the source terminal of the MOSFET 1 and the terminal 5. In that case, it is recommended that the characteristic transmission curve of the MOSFET 1 be made steeper than that of the MOSFET 3. The characteristic transmission curves of the MOSFETs 2 and 4 may be but need not be identical.

In the case of a negative operating voltage $V_{DD}$, the channel types used should be the reverse of those described above.

In the exemplary embodiment, the gate and drain terminals of the MOSFETs 1 and 2 are joined together. However, the gate terminals may also be applied to a fixed potential.

The differing steepness of the characteristic transmission curves, while the parameters are otherwise identical, can be established, for example, by means of differing channel widths of the MOSFETs. In the exemplary embodiment of FIG. 1, the channel widths of the MOSFET 2 would accordingly have to be made greater than that of the MOSFET 4. The channel widths of the MOSFETs 1 and 3 may be identical. Since all of the MOSFETs of the integrated comparator circuit are subjected to the same production conditions, fluctuations in the manufacturing process alter the properties of all four of the MOSFETs in the same way. As a result, the parameters of the integrated comparator configuration are adhered to well, with the effect that the switching point of inverters of one and the same type is essentially independent of production fluctuations.

I claim:

1. An integrated comparator circuit, comprising:
   a) two complementary MOSFETs having main current paths being connected together in a series circuit at a connecting point,
   b) an inverter stage having two complementary MOSFETs with gate terminals connected to the connecting point,
   c) first, second and third terminals, said first and second terminals being for an operating voltage, and said second and third terminals being for a voltage to be compared,
   d) said series circuit being connected between said first and said third terminals, and said inverter stage being connected between said first and said second terminals,
   e) one of said MOSFETs of said series circuit connected to said first terminal and one of said MOSFETs of said inverter stage connected to said first terminal being of the same channel type, and the other of said MOSFETs of said series circuit connected to said third terminal and the other of said MOSFETs of said inverter stage connected said second terminal being of the same channel type, and
   f) all of said MOSFETs having characteristic transmission curves, the characteristic transmission curves of said MOSFETs connected to said first terminal being equal, and the characteristic transmission curve of said MOSFET connected to said third terminal being steeper than the characteristic transmission curve of said MOSFET connected to said second terminal.

2. The integrated comparator circuit according to claim 1, wherein said MOSFETs of said series circuit have gate terminals and drain terminals being connected to one another.

* * * * *